US010217884B2

(12) United States Patent
Yamaguchi et al.

(10) Patent No.: US 10,217,884 B2
(45) Date of Patent: Feb. 26, 2019

(54) PROCESS FOR PRODUCING A SOLAR CELL HAVING AN AROMATIC POLYIMIDE FILM SUBSTRATE FOR HIGH PHOTOELECTRIC CONVERSION EFFICIENCY

(71) Applicant: Ube Industries, Ltd., Ube-shi, Yamaguchi (JP)

(72) Inventors: Hiroaki Yamaguchi, Ube (JP); Takao Miyamoto, Ube (JP); Nobu Iizumi, Ube (JP); Ken Kawagishi, Ube (JP)

(73) Assignee: Ube Industries, Ltd., Ube-shi, Yamaguchi (JP)

( * ) Notice: Subject to any disclaimer, the term of this patent is extended or adjusted under 35 U.S.C. 154(b) by 323 days.

(21) Appl. No.: 15/274,762

(22) Filed: Sep. 23, 2016

(65) Prior Publication Data
US 2017/0040475 A1 Feb. 9, 2017

Related U.S. Application Data

(62) Division of application No. 13/510,878, filed as application No. PCT/JP2010/070723 on Nov. 19, 2010.

(30) Foreign Application Priority Data

Nov. 20, 2009 (JP) .................. 2009-265720

(51) Int. Cl.
*H01L 31/074* (2012.01)
*H01L 31/0392* (2006.01)
(Continued)

(52) U.S. Cl.
CPC ........ *H01L 31/03928* (2013.01); *B29C 41/24* (2013.01); *C08G 73/1067* (2013.01);
(Continued)

(58) Field of Classification Search
CPC ........... H01L 31/03928; H01L 31/0322; H01L 31/0749; C23C 14/20; C23C 14/205
See application file for complete search history.

(56) References Cited

U.S. PATENT DOCUMENTS 4,275,185 A 6/1981 Lu
4,725,484 A 2/1988 Kumagawa et al.
(Continued)

FOREIGN PATENT DOCUMENTS

EP 2 287 239 A1 2/2011
EP 2 292 681 A1 3/2011
(Continued)

OTHER PUBLICATIONS

International Search Report dated Jan. 25, 2011 issued to priority international application No. PCT/JP2010/070723.
(Continued)

*Primary Examiner* — Andrew Q Tran
(74) *Attorney, Agent, or Firm* — Knobbe, Martens, Olson & Bear, LLP

(57) ABSTRACT

A CIS solar cell having flexibility and high conversion efficiency may be produced, using, as a substrate, a polyimide film which is prepared from an aromatic tetracarboxylic acid component comprising 3,3',4,4'-biphenyltetracarboxylic dianhydride as the main component and an aromatic diamine component comprising p-phenylenediamine as the main component, and has a maximum dimensional change in the temperature-increasing step of from 25° C. to 500° C. within a range of from +0.6% to +0.9%, excluding +0.6%, based on the dimension at 25° C. before heat treatment.

22 Claims, 1 Drawing Sheet

(51) Int. Cl.

| | | |
|---|---|---|
| B29C 41/24 | (2006.01) | |
| C08G 73/10 | (2006.01) | |
| C08L 79/08 | (2006.01) | |
| C23C 14/20 | (2006.01) | |
| H01L 31/0749 | (2012.01) | |
| H01L 31/032 | (2006.01) | |
| B29K 79/00 | (2006.01) | |

(52) U.S. Cl.
CPC .............. *C08L 79/08* (2013.01); *C23C 14/20* (2013.01); *C23C 14/205* (2013.01); *H01L 31/0322* (2013.01); *H01L 31/0749* (2013.01); *B29K 2079/08* (2013.01); *Y02E 10/541* (2013.01); *Y02P 70/521* (2015.11); *Y10T 428/31681* (2015.04)

(56) References Cited

U.S. PATENT DOCUMENTS

| | | | |
|---|---|---|---|
| 5,849,397 | A | 12/1998 | Kohno et al. |
| 6,274,805 | B1 | 8/2001 | Nakazawa et al. |
| 2002/0058149 | A1 | 5/2002 | Yamamoto et al. |
| 2003/0212243 | A1 | 11/2003 | Hergenrother et al. |
| 2007/0071910 | A1 | 3/2007 | Ono et al. |
| 2008/0261060 | A1 | 10/2008 | Yamaguchi |
| 2009/0197068 | A1 | 8/2009 | Yamaguchi et al. |
| 2009/0280339 | A1 | 11/2009 | Tsuda et al. |
| 2009/0291281 | A1 | 11/2009 | Hanket |
| 2010/0252309 | A1 | 10/2010 | Yamaguchi et al. |
| 2011/0084419 | A1 | 4/2011 | Uekido et al. |
| 2017/0040475 | A1* | 2/2017 | Yamaguchi ............. B29C 41/24 |

FOREIGN PATENT DOCUMENTS

| | | |
|---|---|---|
| JP | H07-307114 A | 11/1995 |
| JP | H09-148694 A | 6/1997 |
| JP | H11-029645 A | 2/1999 |
| JP | 2003-179238 A | 6/2003 |
| JP | 2005-161858 A | 6/2005 |
| JP | 2007-317834 A | 12/2007 |
| JP | 2009-067042 A | 4/2009 |
| JP | 2009-185101 A | 8/2009 |
| WO | WO 1998/050962 A1 | 11/1998 |

OTHER PUBLICATIONS

International Preliminary Report on Patentability issued in International Application No. PCT/JP2010/070723 dated Jun. 21, 2012.
Kessler, et al., "Technological aspects of flexible CIGS solar cells and modules", Solar Energy, vol. 77, No. 6, pp. 685-695, Dec. 1, 2004.
Extended European Search Report dated Apr. 2, 2013 in European Patent Application No. 10 83 1663.9.

* cited by examiner

PROCESS FOR PRODUCING A SOLAR CELL HAVING AN AROMATIC POLYIMIDE FILM SUBSTRATE FOR HIGH PHOTOELECTRIC CONVERSION EFFICIENCY

RELATED APPLICATIONS

This application is a divisional of U.S. patent application Ser. No. 13/510,878, filed Jun. 8, 2012, which is the US National Phase entry under 35 U.S.C. 371 of PCT/JP2010/070723, filed Nov. 19, 2010, which claims priority under 35 U.S.C. 119a)-(e) to Japanese Patent Application No. 2009-265720, the entire contents of which are incorporated herein by reference,

TECHNICAL FIELD

The present invention relates to a polyimide film having extremely high heat resistance and dimensional stability, which is capable of withstanding a heat treatment at a temperature equal to or higher than 450° C., further at a temperature equal to or higher than about 500° C., and therefore may be suitable as a substrate for a CIS solar cell, in particular. The present invention also relates to a laminate comprising the polyimide film, and a CIS solar cell having high conversion efficiency.

BACKGROUND ART

In recent years, a solar cell (CIS solar cell) comprising a chalcopyrite semiconductor layer such as a layer of $CuInSe_2$ and a solid solution of Ga in $CuInSe_2$, i.e. $Cu(In,Ga)Se_2$ attracts considerable attention as a solar cell having high photoelectric conversion efficiency. A CIS solar cell generally comprises a substrate, a back electrode layer, a chalcopyrite semiconductor layer as a light absorbing layer, a buffer layer, a transparent electrode layer, and an extraction electrode in that order.

Conventionally, glass (soda-lime glass) is used as a substrate for a CIS solar cell, and molybdenum (Mo) is used as a back electrode formed thereon. In addition, a CIS solar cell comprising a flexible film as a substrate has been proposed (See Patent Document 1, for example). As compared with a conventional solar cell comprising a glass substrate, a solar cell comprising a flexible substrate is expected to find widespread application in view of its flexibility and lightweight. Another advantage of a flexible substrate is that a solar cell may be produced in a roll-to-roll process, which is suitable for mass production.

However, a CIS solar cell comprising a flexible substrate such as a polyimide substrate is apt to have lower conversion efficiency than a CIS solar cell comprising a glass substrate. This is because even a polyimide, which is a highly heat-resistant resin, may withstand a temperature of about 450° C. at the highest and may not be heated at a temperature equal to or higher than 450° C., while a heat treatment at a temperature equal to or higher than 450° C., preferably at a temperature equal to or higher than about 500° C., is required for the formation of a high-quality CIS semiconductor thin film having low defect density.

Patent Document 2 discloses a process for producing a CIS solar cell comprising a polyimide substrate and having high conversion efficiency, which comprises steps of;
forming an electrode film on a polyimide substrate;
forming a thin film containing Cu, and In and/or Ga, and Se and/or S on or over the electrode film (in other words, directly or indirectly on the electrode film); and
rapidly heating the thin film to a temperature equal to or higher than 450° C., preferably from 500° C. to 600° C., and maintaining the thin film at the temperature for 10 sec to 300 sec, thereby forming a chalcopyrite semiconductor film.

Patent Document 2 also discloses a process for producing a CIS solar cell, which comprises steps of:
forming an electrode film on a polyimide substrate;
forming a thin film containing Cu, and In and/or Ga on or over the electrode film; and
rapidly heating the thin film to a temperature equal to or higher than 450° C., preferably from 500° C. to 600° C., and maintaining the thin film at the temperature for 10 sec to 300 sec in an atmosphere containing Se and/or S, thereby forming a chalcopyrite semiconductor film.

In these processes, the step of forming a thin film which is a precursor of a semiconductor film and the step of heating the precursor thin film are separately performed, rapid heating is performed in the step of heating the precursor thin film for crystal growth, and therefore a heat treatment at a temperature equal to or higher than 500° C. is performed in a shorter period of time so that a chalcopyrite semiconductor thin film suitable for a light absorbing layer of a solar cell may be prepared. In these processes, however, a heat treatment at a high temperature is still required, even though the heat treatment is performed in a short period of time; therefore mechanical properties of the polyimide substrate may be significantly impaired, and the curling of the polyimide substrate and cracks in the electrode film and/or the semiconductor film may occur when using a conventional polyimide film.

Patent Document 3 discloses a solar cell comprising a substrate film, and a laminate comprising at least an electrode layer and a chalcopyrite semiconductor thin film which is formed on the substrate film, wherein the substrate film is a polyimide film prepared by the polycondensation of an aromatic diamine and an aromatic tetracarboxylic dianhydride, which has a thickness within a range of from 3 μm to 200 μm, an average coefficient of thermal expansion up to 300° C. within a range of from 1 ppm/° C. to 10 ppm/° C., and a tensile strength at break in the length direction of 300 MPa or higher. Patent Document 3 also discloses that a preferable substrate film is a polyimide-benzoxazole film prepared by the polycondensation of an aromatic diamine having a benzoxazole structure and an aromatic tetracarboxylic dianhydride. In Example 8, a CIS solar cell comprising a polyimide film as a substrate, which is prepared from 3,3',4,4'-biphenyltetracarboxylic dianhydride and p-phenylenediamine by thermal imidization, is disclosed. As for the polyimide film disclosed in Patent Document 3, however, the dimensional change and deterioration in the mechanical properties at elevated temperatures (up to 500° C. or higher) should be taken into consideration, although the dimensional change up to 300° C. in a temperature-increasing step is taken into consideration.

Patent Document 4 discloses a process for producing a polyimide insulating film, comprising steps of:
coating a substrate with a polyamide acid varnish, and then
curing the coating film to form a polyimide insulating film; wherein
in the film-forming step, the film is heated and maintained at a temperature of from 100° C. to 160° C. for at least 30 min for the purpose of reducing the residual stress of the insulating film (specifically, reducing the coefficient of thermal expansion). As for Patent Document 4, however, the dimensional change and deterioration in the mechanical properties at elevated temperatures (up to 500° C. or higher) should be taken into consideration, either.

CITATION LIST

Patent Document

Patent Document 1: WO 98/50962 A1
Patent Document 2: JP-A-2003-179238
Patent Document 3: JP-A-2007-317834
Patent Document 4: JP-A-H07-307114

SUMMARY OF INVENTION

Problems to be Solved by the Invention

As described above, there have been no polyimide films having extremely high heat resistance and dimensional stability, which is capable of withstanding a heat treatment at a high temperature. When a conventional polyimide film is heated at a high temperature in the form of laminate in which gas-impermeable layers such as metal layers are formed directly on both sides of the film, the folding endurance (endurance to folding) may be significantly reduced.

Accordingly, an object of the present invention is to provide a polyimide film having extremely high heat resistance and dimensional stability, which is capable of withstanding a heat treatment at a high temperature; more specifically a polyimide film having extremely high heat resistance, and exhibiting excellent dimensional stability and mechanical properties, including folding endurance, after the polyimide film is heated at a high temperature in the form of laminate in which metal layers are formed directly on both sides of the film. Another object of the present invention is to provide a polyimide film for realizing a CIS solar cell having high conversion efficiency, in particular, and a laminate comprising the polyimide film and a conductive layer, which is formed on or over the polyimide film and is to be used as an electrode in a CIS solar cell.

Means for Solving the Problems

The present invention relates to the following items.

[1] A polyimide film prepared from an aromatic tetracarboxylic acid component comprising 3,3',4,4'-biphenyltetracarboxylic dianhydride as the main component and an aromatic diamine component comprising p-phenylenediamine as the main component; wherein
the polyimide film has a maximum dimensional change in the temperature-increasing step of from 25° C. to 500° C. within a range of from +0.6% to +0.9%, excluding +0.6%, based on the dimension at 25° C. before heat treatment.

[2] A polyimide film as described in [1], wherein the polyimide film has a weight loss after heat treatment at 500° C. for 20 min within a range equal to or less than 1 wt %.

[3] A polyimide film as described in any one of [1] to [2], wherein the polyimide film has a coefficient of thermal expansion from 25° C. to 500° C. within a range of from 10 ppm/° C. to 20 ppm/° C., excluding 10 ppm/° C.

[4] A polyimide film as described in any one of [1] to [3], wherein the polyimide film has a thickness within a range of from 7.5 μm to 75 μm.

[5] A laminate comprising a polyimide film as described in any one of [1] to [4], and a metal layer which is formed on or over the polyimide film.

[6] A laminate as described in [5], wherein the metal layer comprises molybdenum.

[7] A laminate as described in any one of [5] to [6], wherein the metal layer is formed by sputtering or vapor deposition.

[8] A CIS solar cell comprising a polyimide film as described in any one of [1] to [4] as a substrate, and further comprising at least a conductive metal layer and a chalcopyrite semiconductor layer on or over the substrate.

[9] A process for producing a polyimide film by thermal imidization, comprising:
a step of reacting an aromatic tetracarboxylic acid component comprising 3,3',4,4'-biphenyltetracarboxylic dianhydride as the main component and an aromatic diamine component comprising p-phenylenediamine as the main component in a solvent to provide a polyimide precursor solution;
a step of flow-casting the obtained polyimide precursor solution on a support, and heating the solution to form a self-supporting film, that is, casting step; and
a step of heating the obtained self-supporting film to conduct the imidization reaction, that is, curing step; wherein
in the casting step, the self-supporting film has a weight loss within a range of from 36% to 39%, this weight loss being calculated by the following formula (A):

$$\text{Weight loss (\%)} = (W1 - W2)/W1 \times 100 \quad (A)$$

wherein W1 represents the weight of the self-supporting film, and W2 represents the weight of the polyimide film after curing; and
in the casting step, the highest temperature (T1) is equal to or lower than the temperature ($T_M$) at which the self-supporting film is thermally deformed; and
in the curing step, the self-supporting film is heated at a temperature lower than the heat deformation temperature ($T_M$), and then the temperature is increased and the film is heated at the highest heat treatment temperature (T2) of from 470° C. to 540° C.

[10] A process for producing a polyimide film as described in [9], wherein the polyimide film produced has a thickness within a range of from 7.5 μm to 75 μm.

[11] A process for producing a polyimide film as described in any one of [9] to [10], wherein in the casting step, the highest temperature (T1) in the heat treatment of the polyimide precursor is equal to or lower than 140° C.

[12] A process for producing a laminate, comprising steps of:
producing a polyimide film according to a production process as described in any one of [9] to [11]; and
forming a metal layer on the surface of the polyimide film.

[13] A process for producing a CIS solar cell, comprising steps of:
producing a polyimide film according to a production process as described in any one of [9] to [11];
forming a metal layer on the surface of the polyimide film;
forming a chalcopyrite semiconductor layer on or over the metal layer; and
heating at a temperature equal to or higher than 450° C.

Effect of the Invention

According to the present invention, there may be provided a polyimide film having extremely high heat resistance and dimensional stability, which is capable of withstanding a heat treatment at a high temperature. Notably, the polyimide film of the present invention may exhibit excellent dimensional stability and mechanical properties, including folding endurance, after the polyimide film is heated at a high temperature in the form of laminate in which gas-impermeable layers such as metal layers are formed directly on both sides of the film. Accordingly, the polyimide film of the present invention is very useful as a polyimide film substrate, which may be used to provide a CIS solar cell having high conversion efficiency.

DESCRIPTION OF EMBODIMENTS

Figure 1:
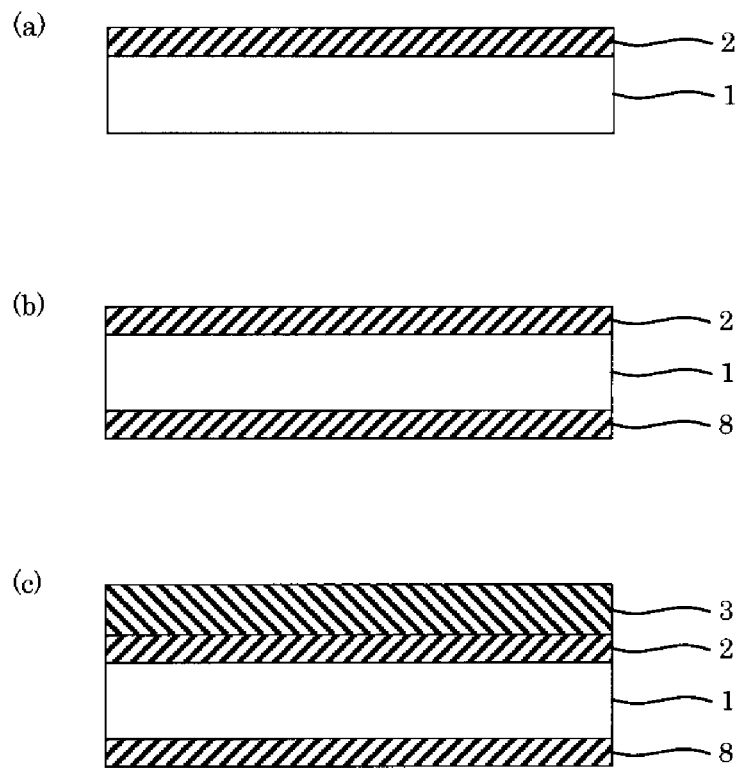
FIG. 1 is a diagram showing a first stage in an example of the process for producing a solar cell of the present invention.

As described above, the polyimide film of the present invention is prepared from an aromatic tetracarboxylic acid component comprising 3,3',4,4'-biphenyltetracarboxylic dianhydride as the main component and an aromatic diamine component comprising p-phenylenediamine as the main component, and has a maximum dimensional change in the temperature-increasing step of from 25° C. to 500° C. within a range of from 0% to 1% (excluding 0%), preferably from +0.6% to +0.9% (excluding +0.6%), particularly preferably from +0.76% to +0.80%, based on the dimension at 25° C. before heat treatment (initial dimension).

In addition, the polyimide film may preferably have a minimum dimensional change in the temperature-decreasing step of from 500° C. to 25° C. within a range of from 0% to −0.8%, more preferably from 0% to −0.3%, based on the initial dimension at 25° C.

A polyimide film which has a dimensional change in the temperature-increasing step of from 25° C. to 500° C. within the above-mentioned range, and preferably has a dimensional change in the temperature-increasing step of from 25° C. to 500° C. within the above-mentioned range and a dimensional change in the temperature-decreasing step of from 500° C. to 25° C. within the above-mentioned range, may be advantageously used in any applications which involve heat treatment at a high temperature, for example, a CIS solar cell. Such a polyimide film may be used to produce a high-quality CIS solar cell having high conversion efficiency, while preventing cracks in a metal layer to be used as an electrode and a semiconductor layer, and delamination of these layers from a substrate.

The term "dimensional change from 25° C. to 500° C." as used herein refers to the percentage of dimensional change of a polyimide film of interest relative to the initial dimension (dimension at 25° C. before heat treatment) both in the MD direction (in the continuous film-forming direction (machine direction); in the length direction) and in the TD direction (in the direction perpendicular to the MD direction; in the width direction) at each temperature in the second temperature-increasing/temperature-decreasing steps, when the dimensional change is measured in the temperature-increasing step of from 25° C. to 500° C. and the subsequent temperature-decreasing step of from 500° C. to 25° C. repeatedly two times by a thermo-mechanical analyzer (TMA) under the following conditions. The values measured in the second temperature-increasing/temperature-decreasing steps are employed so as to eliminate the influences caused by slight differences in water absorption and residual stress.

Measurement mode: Tensile mode, load: 2 g,
Sample length: 15 mm,
Sample width: 4 mm,
Temperature-increasing start temperature: 25° C.,
Temperature-increasing end temperature: 500° C.
(No holding time at 500° C.),
Temperature-decreasing end temperature: 25° C.,
Temperature-increasing and -decreasing rate: 20° C./min,
Measurement atmosphere: Nitrogen.

The dimensional change is defined by the following formula (1).

Herein, the maximum dimensional change (%) in the temperature-increasing step may be calculated from the formula (1) in which L is the maximum dimension in the temperature-increasing step. The minimum dimensional change (%) in the temperature-decreasing step may be calculated from the formula (1) in which L is the minimum dimension in the temperature-decreasing step.

$$\text{Dimensional change (\%)} = (L - L_0)/L_0 \times 100 \quad (1)$$

wherein L represents the length at a measurement temperature, and $L_0$ represents the length at 25° C. before heat treatment.

In addition, the polyimide film may preferably have a weight loss after heat treatment at 500° C. for 20 min in a nitrogen atmosphere within a range equal to or less than 1 wt %, more preferably equal to or less than 0.5 wt %, particularly preferably equal to or less than 0.32 wt %. This indicates that the polyimide film of the present invention has high heat resistance and does not or very little decompose/degrade when heated at a temperature equal to or higher than 500° C.

Herein, the "weight loss after heat treatment at 500° C. for 20 min" is calculated by the following formula (2) from the weights, which are measured as follows. In a nitrogen atmosphere, a polyimide film of interest is heated from room temperature to 500° C. at a rate of 50° C./min, and the weight of the polyimide film is measured immediately after reaching 500° C., and the weight is measured again after maintaining the film at 500° C. for 20 min.

$$\text{Weight loss (\%)} = (W_0 - W)/W_0 \times 100 \quad (2)$$

wherein $W_0$ represents the weight immediately after reaching 500° C., and W represents the weight after maintaining the film at 500° C. for 20 min.

A volatile component such as water and a residual solvent volatilizes before reaching 500° C. Accordingly, the weight loss is an index of the decomposition/thermal degradation of the polyimide. A greater weight loss indicates a greater degradation.

In addition, the polyimide film may preferably have a coefficient of thermal expansion from 25° C. to 500° C. within a range equal to or less than 20 ppm/° C., more preferably from 0 ppm/° C. to 20 ppm/° C., particularly preferably from 10 ppm/° C. to 20 ppm/° C. (excluding 10 ppm/° C.). When a coefficient of thermal expansion of a substrate is substantially different from those of a metal layer to be used as an electrode (in general, Mo layer or W layer) and a chalcopyrite semiconductor layer, a dimensional change of the substrate is substantially different from those of the metal layer to be used as an electrode and the semiconductor layer, even though heat shrinkage of the substrate at a high temperature is reduced. Accordingly, a polyimide film which has a coefficient of thermal expansion within the above-mentioned range may be suitably used as a substrate for a CIS solar cell. In addition, it is preferred that the coefficients of thermal expansion in the directions of both MD and TD are within the above-mentioned range.

The "coefficient of thermal expansion from 25° C. to 500° C." as used herein is an average coefficient of thermal expansion in the directions of MD and TD, which is calculated by the following formula (3) from the dimensional change in the directions of MD and TD in the second temperature-increasing step for the determination of dimensional change from 25° C. to 500° C. as described above. The values measured in the second temperature-increasing step are employed so as to eliminate the influences caused by slight differences in water absorption and residual stress.

$$\text{Coefficient of thermal expansion (ppm/° C.)} = (L-L_0)/\{L_0 \times (T-T_0)\} \times 10^6 \quad (3)$$

wherein L represents the length at 500° C., $L_0$ represents the length at 25° C. before the second heat treatment, T represents 500° C., and $T_0$ represents 25° C.

In the determinations of the dimensional change and the weight loss as described above, all temperatures are measured on the surface of the polyimide film.

In addition, the polyimide film may preferably have a tensile strength at break of 300 MPa or higher. The polyimide film of the present invention may exhibit excellent folding endurance as well as the desired properties as described above.

The polyimide film of the present invention may be produced according to the process as described below.

The polyimide film of the present invention may be produced according to a production process, in which a polyimide film is produced by thermal imidization, comprising:

a step of reacting an aromatic tetracarboxylic acid component comprising 3,3',4,4'-biphenyltetracarboxylic dianhydride as the main component and an aromatic diamine component comprising p-phenylenediamine as the main component in a solvent to provide a polyimide precursor solution;

a step of flow-casting the obtained polyimide precursor solution on a support, and heating the solution to form a self-supporting film, that is, casting step; and a step of heating the obtained self-supporting film to conduct the imidization reaction, that is, curing step;

wherein in the casting step, the self-supporting film has a weight loss within a range of from 36% to 39%, this weight loss being calculated by the following formula (A):

$$\text{Weight loss (\%)} = (W1-W2)/W1 \times 100 \quad (A)$$

wherein W1 represents the weight of the self-supporting film, and W2 represents the weight of the polyimide film after curing; and in the casting step, the highest temperature (T1) is equal to or lower than the temperature ($T_M$) at which the self-supporting film is thermally deformed; and in the curing step, the self-supporting film is heated at a temperature lower than the heat deformation temperature ($T_M$), and then the temperature is increased and the film is heated at the highest heat treatment temperature (T2) of from 470° C. to 540° C.

The production process will be described in more detail below.

Firstly, in the casting step, a self-supporting film of a polyimide precursor solution is prepared. A polyimide precursor solution is a solution of a polyimide precursor to provide a polyimide, i.e. polyamic acid, in an organic solvent, to which an imidization catalyst, an organic phosphorous compound and an inorganic fine particle may be added, if necessary. A self-supporting film may be prepared by flow-casting a polyimide precursor solution on a support, and then heating the solution to make it self-supporting, which means a stage before a common curing process.

The aromatic tetracarboxylic acid component comprises 3,3',4,4'-biphenyltetracarboxylic dianhydride (hereinafter, sometimes abbreviated as "s-BPDA") as the main component; specifically the aromatic tetracarboxylic acid component may comprise 75 mol % or more, more preferably 80 mol % or more, particularly preferably 90 mol % or more, further preferably 95 mol % or more of s-BPDA. It is also highly preferred that 100 mol % of the aromatic tetracarboxylic acid component is s-BPDA. The aromatic diamine component comprises p-phenylenediamine (hereinafter, sometimes abbreviated as "PPD") as the main component; specifically the aromatic diamine component may comprise 75 mol % or more, more preferably 80 mol % or more, particularly preferably 90 mol % or more, further preferably 95 mol % or more of PPD. It is also highly preferred that 100 mol % of the aromatic diamine component is PPD.

In addition to s-BPDA and PPD, other tetracarboxylic acid component(s) and other diamine component(s) may be used, as long as the characteristics of the present invention would not be impaired.

Specific examples of the aromatic tetracarboxylic acid component to be used together with 3,3',4,4'-biphenyltetracarboxylic component in the present invention may include pyromellitic dianhydride, 2,3',3,4'-biphenyltetracarboxylic dianhydride, 3,3',4,4'-benzophenone tetracarboxylic dianhydride, 2,2',3,3'-benzophenone tetracarboxylic dianhydride, 2,2-bis(3,4-dicarboxyphenyl)propane dianhydride, 2,2-bis(2,3-dicarboxyphenyl)propane dianhydride, bis(3,4-dicarboxyphenyl)ether dianhydride, bis(2,3-dicarboxyphenyl) ether dianhydride, 2,3,6,7-naphthalene tetracarboxylic dianhydride, 1,4,5,8-naphthalene tetracarboxylic dianhydride, 1,2,5,6-naphthalene tetracarboxylic dianhydride, 2,2-bis(3,4-dicarboxyphenyl)-1,1,1,3,3,3-hexafluoropropane dianhydride, and 2,2-bis(2,3-dicarboxyphenyl)-1,1,1,3,3,3-hexafluoropropane dianhydride. Specific examples of the aromatic diamine component to be used together with p-phenylenediamine may include m-phenylenediamine, 2,4-diaminotoluene, 2,6-diaminotoluene, 4,4'-diaminodiphenylmethane, 4,4'-diaminodiphenyl ether, 3,4'-diaminodiphenyl ether, 3,3'-dimethyl-4,4'-diaminobiphenyl, 2,2'-dimethyl-4,4'-diaminobiphenyl, 2,2'-bis(trifluoromethyl)-4,4'-diaminobiphenyl, 4,4'-diaminobenzophenone, 3,3'-diaminobenzophenone, 4,4'-bis(4-aminophenyl)sulfide, 4,4'-diaminodiphenyl sulfone, 4,4'-diaminobenzanilide, 1,4-bis(4-aminophenoxy)benzene, 1,3-bis(4-aminophenoxy)benzene, 1,3-bis(3-aminophenoxy)benzene, 4,4'-bis(4-aminophenoxy)biphenyl, 4,4'-bis(3-aminophenoxy)biphenyl, 2,2-bis(4-aminophenoxyphenyl)propane, bis[4-(4-aminophenoxy)phenyl]sulfone, bis[4-(3-aminophenoxy)phenyl]sulfone, and 2,2-bis[4-(4-aminophenoxy)phenyl]hexafluoropropane. Among others, preferred is a diamine having one or two benzene rings.

A polyimide precursor, i.e. polyamic acid, may be synthesized by random-polymerizing or block-polymerizing substantially equimolar amounts of an aromatic tetracarboxylic dianhydride and an aromatic diamine in an organic solvent. Alternatively, two or more polyimide precursors in which either of these two components is excessive may be prepared, and subsequently, these polyimide precursor solutions may be combined and then mixed under reaction conditions. The polyimide precursor solution thus obtained may be used without any treatment, or alternatively, after removing or adding a solvent, if necessary, to prepare a self-supporting film.

Examples of an organic solvent for the polyimide precursor solution include N-methyl-2-pyrrolidone, N,N-dimethylformamide, N,N-dimethylacetamide and N,N-diethylacetamide. These organic solvents may be used alone or in combination of two or more. The solvent to be used may be most preferably N,N-dimethylacetamide.

The polyimide precursor solution may contain an imidization catalyst, an organic phosphorous-containing compound, an inorganic fine particle, and the like, if necessary.

Examples of the imidization catalyst include substituted or unsubstituted nitrogen-containing heterocyclic compounds, N-oxide compounds of the nitrogen-containing heterocyclic compounds, substituted or unsubstituted amino acid compounds, hydroxyl-containing aromatic hydrocarbon compounds, and aromatic heterocyclic compounds. Particularly preferable examples of the imidization catalyst to be used include lower-alkyl imidazoles such as 1,2-dimethylimidazole, N-methylimidazole, N-benzyl-2-methylimidazole, 2-methylimidazole, 2-ethyl-4-methylimidazole and 5-methylbenzimidazole; benzimidazoles such as N-benzyl-2-methylimidazole; and substituted pyridines such as isoquinoline, 3,5-dimethylpyridine, 3,4-dimethylpyridine, 2,5-dimethylpyridine, 2,4-dimethylpyridine and 4-n-propylpyridine. The amount of the imidization catalyst to be used is preferably about 0.01 to 2 equivalents, particularly preferably about 0.02 to 1 equivalents relative to the amount of an amide acid unit in a polyamide acid. When the imidization catalyst is used, the polyimide film obtained may have improved properties, particularly extension and edge-cracking resistance.

Examples of the organic phosphorous-containing compound include phosphates such as monocaproyl phosphate, monooctyl phosphate, monolauryl phosphate, monomyristyl phosphate, monocetyl phosphate, monostearyl phosphate, triethyleneglycol monotridecyl ether monophosphate, tetraethyleneglycol monolauryl ether monophosphate, diethylene glycol monostearyl ether monophosphate, dicaproyl phosphate, dioctyl phosphate, dicapryl phosphate, dilauryl phosphate, dimyristyl phosphate, dicetyl phosphate, distearyl phosphate, tetraethyleneglycol mononeopentyl ether diphosphate, triethylene glycol monotridecyl ether diphosphate, tetraethyleneglycol monolauryl ether diphosphate, and diethyleneglycol monostearyl ether diphosphate; and amine salts of these phosphates. Examples of the amine include ammonia, monomethylamine, monoethylamine, monopropylamine, monobutylamine, dimethylamine, diethylamine, dipropylamine, dibutylamine, trimethylamine, triethylamine, tripropylamine, tributylamine, monoethanolamine, diethanolamine and triethanolamine.

Examples of the inorganic fine particle include particulate inorganic oxide powders such as titanium dioxide powder, silicon dioxide (silica) powder, magnesium oxide powder, aluminum oxide (alumina) powder and zinc oxide powder; particulate inorganic nitride powders such as silicon nitride powder and titanium nitride powder; inorganic carbide powders such as silicon carbide powder; and particulate inorganic salt powders such as calcium carbonate powder, calcium sulfate powder and barium sulfate powder. These inorganic fine particles may be used in combination of two or more. These inorganic fine particles may be homogeneously dispersed using the known means.

A self-supporting film of a polyimide precursor solution may be prepared by flow-casting the above-mentioned solution of a polyimide precursor in an organic solvent, or a polyimide precursor solution composition which is prepared by adding an imidization catalyst, an organic phosphorous-containing compound, an inorganic fine particle, and the like to the above solution, on a support; and then heating the solution or composition to the extent that the film becomes self-supporting, which means a stage before a common curing process, for example, to the extent that the film may be peeled from the support.

The content of the polyimide precursor in the polyimide precursor solution may be preferably about 10 wt % to about 30 wt %.

A substrate having a smooth surface may be suitably used as the support. A stainless substrate or a stainless belt may be used as the support, for example. An endless substrate such as an endless belt may be suitably used for continuous production.

The present invention is characterized in that a polyimide precursor solution is heated at a relatively low temperature in the casting step for forming a self-supporting film. The term "self-supporting film" as used herein refers to a film which is in a state to be peeled off from the support.

Specifically, the self-supporting film prepared in the casting step has a weight loss within a range of from 36% to 39%, this weight loss being calculated by the following formula (A):

$$\text{Weight loss (\%)} = (W1 - W2)/W1 \times 100 \tag{A}$$

wherein W1 represents the weight of the self-supporting film, and W2 represents the weight of the polyimide film after curing.

Moreover, the highest temperature (T1) in the casting step is equal to or lower than the temperature ($T_M$) at which the self-supporting film is thermally deformed.

More specifically, at least the temperature at which the polyimide precursor solution loses its fluidity (solidifies) by drying is equal to or lower than the temperature ($T_M$). In that case, the temperature in the casting step overall is equal to or lower than the heat deformation temperature ($T_M$).

Some embodiments of the temperature conditions in the casting step will be briefly described below. In every case, the temperature (T1) is equal to or lower than the temperature ($T_M$).

1. The temperature is increased stepwise in the casting step.
2. The initial temperature is high at and from the starting point of the casting step; and around and after the middle stage of the casting step, and more specifically, at the latter half of the stage in which the polyimide precursor solution loses its fluidity (solidifies) by drying, the temperature is decreased from the initial temperature so that the polyimide precursor solution may be heated at a relatively low temperature.

If the highest temperature at the middle stage of the casting step is set to be lower than the above-mentioned temperature, the casting inlet temperature, for example, may be selected without any limitation. The term "middle stage of the casting step" as used herein refers to the stage in which the polyimide precursor solution loses its fluidity by solvent evaporation.

For the sake of simplicity, hereinafter, "the temperature at which the self-supporting film having a weight loss of from 36% to 39% is thermally deformed" is sometimes referred to as "heat deformation temperature ($T_M$)".

Herein, the "weight loss" is calculated by the following formula (A):

$$\text{Weight loss (\%)} = (W1 - W2)/W1 \times 100 \tag{A}$$

wherein W1 represents the weight of the self-supporting film, and W2 represents the weight of the polyimide film after curing.

The "heat deformation temperature" is a temperature at which the elongation (%) increases rapidly, which is determined from the elongation (%) versus temperature (° C.) graph, when the elongation (%) is measured by a thermomechanical analyzer (TMA) while heating the self-supporting film under the following conditions.

Measurement mode: Tensile mode, load: 4 g,
Sample length: 15 mm,
Sample width: 4 mm,
Temperature-increasing start temperature: 25° C.,
Temperature-increasing end temperature: 500° C.
(No holding time at 500° C.),
Temperature-decreasing end temperature: 25° C.,
Temperature-increasing rate: 20° C./min,
Measurement atmosphere: Air.

A measurement sample of a self-supporting film having a weight loss of from 36% to 39% may be prepared by flow-casting a polyimide precursor solution on a support, and then heating the solution, for example, at a temperature of from 60° C. to 130° C., for example, at a temperature of from 80° C. or 100° C. for a predetermined time to evaporate the solvent. The heat deformation temperature ($T_M$), which may slightly vary depending on the components and the like, may be within a range of from 135° C. to 140° C. The highest temperature (T1) in the casting step may be preferably equal to or lower than 140° C., more preferably equal to or lower than 135° C. The highest temperature (T1) in the casting step is generally equal to or higher than 100° C., preferably equal to or higher than 115° C., more preferably equal to or higher than 117° C.

In the preparation of a self-supporting film, the heating time may be appropriately selected, and may be within a range of from about 3 min to about 60 min, for example.

The self-supporting film obtained after the casting step may preferably have a weight loss, which is calculated from the above-mentioned formula (A), within a range of from 20 wt % to 50 wt %, more preferably equal to or less than 40 wt %, particularly preferably equal to or less than 39 wt %. The self-supporting film obtained after the casting step may have a weight loss of more than 39 wt %. In that case, however, the heat treatment conditions may be preferably selected so that the film may be heated at a temperature equal to or lower than the "heat deformation temperature ($T_M$)" at the early stage of the subsequent curing step until the film has a weight loss of 39 wt % or less.

The self-supporting film obtained after the casting step may preferably have an imidization rate within a range of from 3% to 50%, more preferably from 7% to 30%. A self-supporting film which has a weight loss within the above-mentioned range and an imidization rate within the above-mentioned range is preferred, because the self-supporting film may have sufficient mechanical properties, and a coupling agent solution, if it is applied, may be more evenly and more easily applied to the surface of the self-supporting film, and no foaming, flaws, crazes, cracks and fissures are observed in the polyimide film obtained after imidizing.

The imidization rate of a self-supporting film may be calculated based on the ratio of the vibration band peak area or height measured with an IR spectrometer (ATR) between the self-supporting film and a fully-cured product. The vibration band peak utilized in the procedure may be a symmetric stretching vibration band of an imide carbonyl group and a stretching vibration band of a benzene ring skeleton. The imidization rate may be also determined in accordance with the procedure described in JP-A-H09-316199, using a Karl Fischer moisture meter.

The inventors assume that the orientation of the polymer chain is promoted when the casting step is performed at a relatively low temperature, as follows. In the casting step, as the solvent is evaporated, the film shrinks. Because the film is fixed in the x-y plane direction, however, the film substantially shrinks only in the thickness direction. Accordingly, from the viewpoint of x-y direction, it apparently has the same effect as if the film is stretched in the x-y direction. The phenomenon which actually occurs in the casting step will be explained below. During the early stage, the solvent is evaporated while the fluidity is maintained, and the orientation is not promoted. And then, the flow-cast film is solidified (into a state in which free molecular motion of the polymer is restricted), and the thickness of the film is reduced in the x-y direction through the subsequent solvent evaporation. The stretching of the flow-cast film substantially proceeds after the film is solidified, and the stretch ratio depends on the polymer concentration of the solidified film. When the temperature is low at this stage, the solidified film has a low polyamic acid concentration and a self-supporting film, which is more effectively stretched, is formed. There is a possibility of an orientation relaxation in the subsequent temperature-increasing step in the case of the state of the orientation which is formed at a low temperature. Meanwhile, when there is substantially no or possibly little solvent which can move freely, the higher-order structure is fixed while maintaining the state of the orientation. When a self-supporting film has a weight loss of from 36% to 39%, the solvent is bound to an amic acid in the form of salt, for example, and therefore the solvent which can move freely is hardly present therein. It is assumed that the salt is formed from the solvent and the amic acid at a ratio of 1:1. On this assumption, the amount of solvent which can move freely (free solvent) is 0 when a self-supporting film has a weight loss of 36%. Theoretically, the amount of solvent which can move freely is 3% when a self-supporting film has a weight loss of 39%. Accordingly, when a self-supporting film prepared in the casting step has a weight loss of from 36% to 39%, there is substantially no solvent which can move freely, or the amount of solvent which can move freely is within a range of from 0% to 3% (excluding 0%), that is, a state in which there is possibly little solvent which can move freely. This is one of embodiments in which a self-supporting film prepared in the casting step has a weight loss of from 36% to 39%, and the self-supporting film according to the present invention is not limited to the embodiment. For this reason, it is preferred that a polyimide precursor solution (and the resulting film) is heated (dried) at a temperature equal to or lower than the heat deformation temperature ($T_M$) until the film has a weight loss of 39 wt % or less (in the casting step and at the early stage of the subsequent curing step).

According to the present invention, a solution of a surface treatment agent such as a coupling agent and a chelating agent may be applied to one side or both sides of the self-supporting film thus obtained, if necessary.

Examples of the surface treatment agent include various surface treatment agents that improve adhesiveness or adherence, and include various coupling agents and chelating agents such as a silane-based coupling agent, a borane-based coupling agent, an aluminium-based coupling agent, an aluminium-based chelating agent, a titanate-based coupling agent, a iron-based coupling agent, and a copper-based coupling agent. When using a coupling agent such as a silane coupling agent as a surface treatment agent, the more remarkable effect may be achieved.

Examples of the silane-based coupling agent include epoxysilane-based coupling agents such as γ-glycidoxypropyl trimethoxy silane, γ-glycidoxypropyl diethoxy silane, and β-(3,4-epoxycyclohexyl)ethyl trimethoxy silane; vinylsilane-based coupling agents such as vinyl trichloro silane, vinyl tris(β-methoxy ethoxy) silane, vinyl triethoxy silane, and vinyl trimethoxy silane; acrylsilane-based coupling agents such as γ-methacryloxypropyl trimethoxy silane; aminosilane-based coupling agents such as N-β-(aminoethyl)-γ-aminopropyl trimethoxy silane, N-β-(aminoethyl)-γ-aminopropylmethyl dimethoxy silane, γ-aminopropyl triethoxy silane, and N-phenyl-γ-aminopropyl trimethoxy silane; γ-mercaptopropyl trimethoxy silane, and γ-chloropropyl trimethoxy silane. Examples of the titanate-based coupling agent include isopropyl triisostearoyl titanate, isopropyl tridecyl benzenesulfonyl titanate, isopropyl tris(dioctyl pyrophosphate) titanate, tetraisopropyl bis(dioctyl phosphate) titanate, tetra(2,2-diallyloxymethyl-1-butyl) bis(ditridecyl)phosphate titanate, bis(dioctyl pyrophosphate) oxyacetate titanate, bis(dioctyl pyrophosphate)ethylene titanate, isopropyl trioctanoyl titanate, and isopropyl tricumyl phenyl titanate.

The coupling agent may be preferably a silane-based coupling agent, particularly preferably an aminosilane-based coupling agents such as γ-aminopropyl-triethoxy silane, N-β-(aminoethyl)-γ-aminopropyl-triethoxy silane, N-(aminocarbonyl)-γ-aminopropyl triethoxy silane, N-[β-(phenylamino)-ethyl]-γ-aminopropyl triethoxy silane, N-phenyl-γ-aminopropyl triethoxy silane, and N-phenyl-γ-aminopropyl trimethoxy silane. Among them, N-phenyl-γ-aminopropyl trimethoxy silane is particularly preferred.

Examples of the solvent for the solution of a surface treatment agent such as a coupling agent and a chelating agent may include those listed as the organic solvent for the polyimide precursor solution (the solvent contained in the self-supporting film). The preferable organic solvent may be a solvent compatible with the polyimide precursor solution, and may be the same as the organic solvent for the polyimide precursor solution. The organic solvent may be a mixture of two or more compounds.

The content of the surface treatment agent such as a coupling agent and a chelating agent in the surface treatment agent solution (organic solvent solution) may be preferably 0.5 wt % or more, more preferably 1 wt % to 100 wt %, particularly preferably 1.2 wt % to 60 wt %, further preferably 1.5 wt % to 30 wt %. The content of water in the surface treatment agent solution may be preferably 20 wt % or less, more preferably 10 wt % or less, particularly preferably 5 wt % or less. A solution of a surface treatment agent in an organic solvent may preferably have a rotational viscosity (solution viscosity measured with a rotation viscometer at a temperature of 25° C.) of 0.8 centipoise to 50,000 centipoise.

A particularly preferable solution of a surface treatment agent in an organic solvent may have a low viscosity (specifically, rotational viscosity: 0.8 to 5,000 centipoise) and comprise a surface treatment agent, which is homogeneously dissolved in an amide solvent, in an amount of 0.5 wt % or more, particularly preferably 1.2 wt % to 60 wt %, further preferably 1.5 wt % to 30 wt %.

The application amount of the solution of the surface treatment agent may be appropriately selected, and may be preferably 1 g/m² to 50 g/m², more preferably 2 g/m² to 30 g/m², particularly preferably 3 g/m² to 20 g/m², for example. The application amount of the surface treatment agent solution to one side may be the same as, or different from the application amount of the surface treatment agent solution to the other side.

The solution of the surface treatment agent may be applied by any known method, including, for example, gravure coating, spin coating, silk screen process, dip coating, spray coating, bar coating, knife coating, roll coating, blade coating, and die coating.

Subsequently, in the curing step, the self-supporting film is heated to effect imidization, thereby producing a polyimide film.

In the curing step, the self-supporting film may be preferably heated gradually for about 0.05 hr to about 5 hr, more preferably 0.1 hr to 3 hr so that the imidization may be completed during this heat treatment. This heat treatment may be preferably conducted as the multistage temperature-increasing process in which the temperature is increased stepwise. The present invention is characterized in that the self-supporting film is heated at a temperature lower than the "heat deformation temperature $(T_M)$" in the initial heating step, and then the temperature is increased and the film is heated at the highest heat treatment temperature (T2) of from 470° C. to 540° C. In other words, the highest temperature (T1) in the casting step is equal to or lower than the temperature $(T_M)$ at which the self-supporting film is thermally deformed; and the temperature at which the self-supporting film is heated at the early stage of the curing step is equal to or lower than the "heat deformation temperature $(T_M)$". The temperature may be preferably increased stepwise.

The term "initial heating step" as used herein refers to the first heating step as described later; specifically an region (zone) from the inlet of the curing oven to the point where the temperature is lower than the heat deformation temperature $(T_M)$.

In the multistage temperature-increasing process, it is preferred that the self-supporting film is heated at a temperature lower than the heat deformation temperature $(T_M)$ in the initial heating step, and then the temperature is increased and the film is heated at the highest heat treatment temperature (T2) of from 470° C. to 540° C.

Accordingly, the curing step of the present invention comprises at least the first heating step of heating a self-supporting film at a temperature lower than the "heat deformation temperature $(T_M)$", preferably at a temperature equal to or higher than the temperature lower by 60° C. than the "heat deformation temperature $(T_M)$", and lower than the "heat deformation temperature $(T_M)$", more preferably at a temperature equal to or higher than the temperature lower by 50° C. than the "heat deformation temperature $(T_M)$", and lower than the "heat deformation temperature $(T_M)$", further preferably at a temperature equal to or higher than the temperature lower by 40° C. than the "heat deformation temperature $(T_M)$", and lower than the "heat deformation temperature $(T_M)$";

the middle heating step of heating the film at a temperature equal to or higher than the "heat deformation temperature $(T_M)$", and lower than the highest heat treatment temperature (T2) (470° C. or higher, preferably 490° C. or higher, more preferably 495° C. or higher);

the high-temperature heating step of heating the film at the highest heat treatment temperature (T2), i.e. at a temperature equal to or higher than 470° C., preferably at a temperature equal to or higher than 490° C., more preferably at a temperature equal to or higher than 495° C.; and a step of cooling the film after the high-temperature heating step.

(With the proviso that the range of temperature in the middle heating step does not overlap with the range of temperature in the high-temperature heating step.)

The heat treatment temperature in the first heating step may be preferably lower than the "heat deformation temperature ($T_M$)" and, in general, may be preferably equal to or lower than 140° C., more preferably equal to or lower than 135° C. as the upper limit. The heat treatment temperature in the first heating step may be preferably equal to or higher than the temperature lower by 60° C. than the "heat deformation temperature ($T_M$)" and, in general, may be preferably equal to or higher than 100° C., more preferably equal to or higher than 115° C., more preferably equal to or higher than 117° C. as the lower limit. It is important for the preparation of a film exhibiting excellent dimensional stability that the amount of solvent which can move freely is reduced as much as possible by a heat treatment at a relatively low temperature in the first heating step. The "state in which the amount of solvent which can move freely is reduced as much as possible" refers to the state in which there is substantially no or little solvent which can move freely, as described in the section "casting step". From this viewpoint, the first heating step may be preferably conducted for a longer time. Actually, however, the temperature pattern is set so that the total heat treatment time may not be excessively long. The heat treatment time of the first heating step may be, for example, from about 0.5 min to about 30 min, preferably from about 1 min to about 20 min, more preferably from 2 min to 15 min.

In the middle heating step, the temperature may be preferably increased gradually to lower than the highest heat treatment temperature (T2), i.e. to lower than 470° C., preferably lower than 490° C., more preferably lower than 495° C. The middle heating step may be preferably a multistage heat treatment, which comprises a step of heating the film at a temperature equal to or higher than the "heat deformation temperature ($T_M$)" (preferably, 140° C. or 135° C.) and lower than 200° C. for 10 sec to 30 min, preferably for 30 sec to 10 min;

a step of heating the film at a temperature equal to or higher than 200° C. and lower than 350° C. for 10 sec to 30 min, preferably for 30 sec to 10 min; and a step of heating the film at a temperature equal to or higher than 350° C. and lower than the highest heat treatment temperature (T2) (470° C. or higher, preferably 490° C. or higher, more preferably 495° C. or higher) for 10 sec to 30 min, preferably for 30 sec to 10 min.

In the high-temperature heating step, the film is heated at a temperature equal to or higher than 470° C., preferably at a temperature equal to or higher than 490° C., more preferably at a temperature equal to or higher than 495° C., for about 5 sec to about 5 min, preferably for about 10 sec to about 3 min, more preferably to about 2 min. The highest heat treatment temperature (T2) consists in the high-temperature heating step.

It is preferred that the film is subjected to a heat treatment as necessary, in the cooling step after the high-temperature heating step, which allow a reduction in the residual stress in the film.

In the cooling step, the film may be preferably cooled by a multistage process; specifically cooled at a temperature lower than the highest heating temperature and equal to or higher than 300° C. for 0.5 min to 30 min, more preferably for about 1 min to about 10 min, and then cooled at a temperature lower than 300° C. and equal to or higher than the room temperature for 0.5 min to 30 min, more preferably for about 1 min to about 10 min.

The highest curing temperature (T2) is related to a reduction in the residual volatile component in the film and an improvement in the density of the film, in particular. As the temperature (T2) is higher, the resulting heat resistance and folding endurance are enhanced. Meanwhile, when the temperature (T2) is excessively high, thermal decomposition occurs clearly. Accordingly, the temperature (T2) is equal to or lower than the temperature at which the thermal decomposition occurs, and may be preferably 540° C. or lower, more preferably 530° C. or lower, further preferably 525° C. or lower.

In the curing step, the heat treatment may be preferably conducted, while continuously conveying the self-supporting film in a curing oven comprising certain heating zones. The long solidified film may be conveyed in a curing oven while fixing at least both edges of the film in the direction perpendicular to the length direction, i.e. in the width direction, with a pin tenter, a clip or a frame, for example. The film may be stretched and/or shrunk in the width direction, as necessary, during heat treatment. According to the present invention, however, there may be provided a polyimide film having the desired properties by a heat treatment with the film width held substantially constant, in which the film is slightly stretched and/or shrunk only for reduced wrinkles that occurs due to the dimensional change of the film associated with the change in temperature.

In addition, a post-heat treatment step may be performed so as to reduce the residual stress, as necessary. This purpose may be achieved by heating the film at a temperature of from 250° C. to 500° C., using an apparatus for conveying the film under no tension or a low tension. This step may be a successive step following the film-forming, or alternatively, may be an off-line step.

A polyimide film which has a maximum dimensional change in the temperature-increasing step of from 25° C. to 500° C. within a range of from 0% to +1% (excluding 0%), preferably from +0.6% to +0.9% (excluding +0.6%), particularly preferably from +0.76% to +0.80%, based on the dimension at 25° C. before heat treatment may be produced by the process as described above. The polyimide film may have a weight loss after heat treatment at 500° C. for 20 min within a range equal to or less than 1 wt %, and have a coefficient of thermal expansion in the temperature-increasing step of from 25° C. to 500° C. within a range equal to or less than 20 ppm/° C.

In addition, it has been found that the polyimide film may exhibit highly excellent folding endurance. For reasons that are not yet clear, when a polyimide film is heat-treated in the form of laminate in which gas-impermeable films are formed on both sides of the polyimide film, the folding endurance of the substrate film may be reduced. This will be an obstacle to the use of a polyimide film, for example, as a material for a flexible solar cell substrate. As the result of the research, it has been found that the reduction in folding endurance is dependent on the highest curing temperature in the formation of the polyimide film, and the reduction in folding endurance is less as a polyimide film is heat-treated at a higher temperature, with the proviso that the heat treatment temperature is below the temperature at which the film itself thermally decomposes remarkably. Meanwhile, it is assumed that a component degassed at a higher temperature exerts some action, because the folding endurance is not so reduced when a polyimide film is heat-treated in the form of laminate in which a gas-impermeable film is formed on only one side of the polyimide film.

In the production of CIS solar cells having high conversion efficiency, a substrate film is heated at a high temperature in the form of laminate in which gas-impermeable films, including a conductive layer, are formed on both sides of the film. Accordingly, the polyimide film of the present invention is highly suitable as a substrate for a CIS solar cell. The polyimide film of the present invention may be suitably used especially for a CIS solar cell, which is used in in-car applications and other applications where the solar cell is subjected to vibrations again and again, because the polyimide film exhibits excellent folding endurance.

The thickness of the polyimide film may be, but not limited to, from about 7.5 µm to about 75 µm, preferably from about 10 µm to about 60 µm.

A polyimide film obtained according to the present invention has improved adhesiveness, sputtering properties (suitability for sputtering), and metal vapor deposition properties (suitability for metal vapor deposition). A metal layer (including an alloy layer) may be formed on the polyimide film by a metallizing method such as sputtering and metal vapor deposition, to provide a metal-laminated polyimide film having excellent adherence and sufficiently high peel strength. A metal layer may be laminated on the polyimide film according to a known method.

Examples of the metal layer include layers of metals such as nickel, chromium, manganese, aluminum, iron, molybdenum, cobalt, tungsten, vanadium, titanium, tantalum and copper, and alloys thereof, and layers of oxides of these metals, and layers of carbides of these metals. A layer of molybdenum and a layer of tungsten, for example, may be a conductive layer to be used as an electrode in a CIS solar cell, and the like.

A polyimide-metal laminate to be used for the production of a CIS solar cell, and the like comprises a metal layer, which is formed on or over the polyimide film and is to be used as an electrode. The polyimide-metal laminate may comprise, for example, a layer containing a metal such as molybdenum and tungsten, which is formed on or over the polyimide film and is to be used as an electrode.

The laminate of the present invention may comprise metal layers, which are formed on both sides of the polyimide film. In that case, one of metal layers is to be used as an electrode in a CIS solar cell, and the other is to be used as a protective layer formed on a back surface of a substrate. The two metal layers may be the same, or may be different from each other, and preferably the two layers may be the same.

In the present invention, as described later, a metal layer to be used as an electrode may be preferably formed on the side (Side B) of a polyimide film which was in contact with a support when producing a self-supporting film thereof. Accordingly, when the laminate of the present invention comprises a single metal layer on one side of the polyimide film, the metal layer to be used as an electrode, which may be preferably a layer containing molybdenum or tungsten, more preferably a layer containing molybdenum, may be preferably formed on the Side B.

A metal layer, preferably a metal layer containing molybdenum or tungsten which is to be used as an electrode, may be formed on the polyimide film by sputtering, vapor deposition, and the like. The conditions for forming the metal layer may be appropriately selected according to a known method.

A thickness of a metal layer, preferably a metal layer containing molybdenum or tungsten which is to be used as an electrode, may be appropriately selected depending on an intended application, and may be preferably from about 50 nm to about 500 nm.

The number of metal layers may be appropriately selected depending on an intended application, and two or more metal layers may be formed.

The CIS solar cell of the present invention will now be described below. The CIS solar cell of the present invention is characterized by comprising, as a substrate, a polyimide film as described above.

The CIS solar cell of the present invention may be produced according to any known method, for example, a method described in JP-A-2003-179238. An example of the process for producing the CIS solar cell will now be described with reference to FIGS. 1 to 2.

Firstly, an electrode layer 2 is formed on a polyimide film 1 as a substrate, as illustrated in FIG. 1 (a). The electrode layer 2 is a conductive material layer, and generally a metal layer, preferably a Mo layer. The electrode layer 2 may be formed by sputtering or vapor deposition.

According to the present invention, the electrode layer 2 may be preferably formed on the side (Side B) of the polyimide film which was in contact with a support when producing a self-supporting film thereof, from among the two sides of the polyimide film. A CIS solar cell comprising an electrode layer formed on the Side B may have fewer cracks in an electrode layer and a semiconductor layer, as compared with a CIS solar cell comprising an electrode layer formed on the side (Side A) opposite Side B.

A ground metal layer may be formed between the polyimide film 1 as a substrate and the electrode layer 2, if necessary. The ground metal layer may be formed by a metallizing method such as sputtering and vapor deposition, for example.

Subsequently, as illustrated in FIG. 1 (b), a protective layer 8 is formed on a back surface of the polyimide substrate 1. When such a protective layer is formed, cracks in an electrode layer and a semiconductor layer, and curling of a substrate may be further reduced.

The protective layer 8 may be preferably, but not limited to, a metal layer, particularly preferably a layer of the same metal as the electrode layer 2 (preferably, Mo layer). The protective layer 8 may be formed by sputtering or vapor deposition.

The protective layer 8 is provided when necessary. When a polyimide film having extremely high heat resistance and dimensional stability as described above is used as a substrate, cracks in an electrode layer and a semiconductor layer may be sufficiently reduced without forming a protective layer.

In the present invention, the protective layer 8 may be preferably formed after forming the electrode layer 2, although the electrode layer 2 may be formed after forming the protective layer 8. When the electrode layer 2 is formed before forming the protective layer 8, in other words, when an earlier-formed metal layer (molybdenum layer) is used as an electrode, cracks in an electrode layer and a semiconductor layer may be further reduced.

As described above, the electrode layer may be preferably formed on the Side B. Accordingly, in a process for producing a solar cell of the present invention, it is particularly preferred that an electrode layer is formed on the Side B of a polyimide film, which is a substrate, and then a protective layer is formed on the Side A of the polyimide film.

Subsequently, as illustrated in FIG. 1 (c), a thin film 3 containing a Group IB element, a Group IIIB element and a Group VIB element is formed on the electrode layer 2. The thin film 3 typically consists of a Group IB element, a Group IIIB element and a Group VIB element, and is converted into a light absorbing layer of a solar cell by a subsequent heat treatment. The Group IB element may be preferably Cu. The Group IIIB element may be preferably at least one selected from the group consisting of In and Ga. The Group VIB element may be preferably at least one selected from the group consisting of Se and S.

The thin film 3 may be formed by vapor deposition or sputtering. The substrate temperature during the formation of the thin film 3 may be within a range of from room temperature (about 20° C.) to about 400° C., for example, and is lower than the highest temperature in the subsequent heat treatment.

The thin film 3 may be a multi-layer film comprising two or more layers.

A layer containing a Group IA element such as Li, Na and K, and other layers may be formed between the electrode layer 2 and the thin film 3. Examples of the layer containing a Group IA element include a layer of $Na_2S$, a layer of NaF, a layer of $Na_2O_2$, a layer of $Li_2S$ and a layer of LiF. These layers may be formed by vapor deposition or sputtering.

Figure 2:
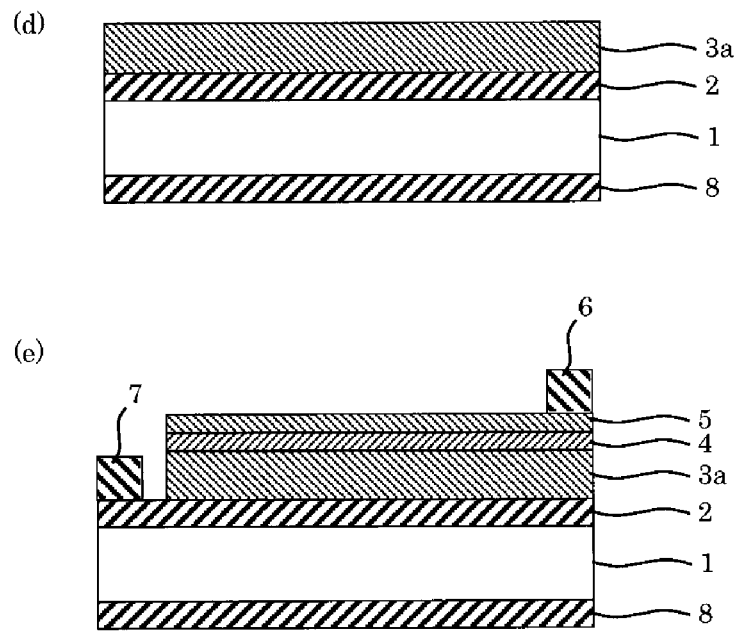
FIG. 2 is a diagram showing a second stage in the example of the process for producing a solar cell of the present invention.

Subsequently, as illustrated in FIG. 2 (d), a semiconductor layer (chalcopyrite semiconductor layer) 3a containing a Group IB element, a Group IIIB element and a Group VIB element is formed by subjecting the thin film 3 to heat treatment. The semiconductor layer 3a functions as a light absorbing layer of a solar cell.

The thin film may be preferably heated in a nitrogen gas atmosphere, in an oxygen gas atmosphere, or in an argon gas atmosphere to convert the thin film into the semiconductor layer. The heat treatment may be also preferably performed in an atmosphere containing at least one selected from the group consisting of Se and S.

It is preferred that the thin film 3 is heated to a temperature of from 450° C. to 550° C., preferably from 480° C. to 550° C., more preferably from 490° C. to 540° C., particularly preferably from 500° C. to 530° C., preferably at a rate of from 10° C./sec to 50° C./sec, and maintained at a temperature within the range preferably for 10 sec to 5 min. And then, the thin film 3 is allowed to cool (cooled naturally), or alternatively, the thin film 3 is cooled more slowly using a heater.

The heat treatment may be performed stepwise. It is preferred, for example, that the thin film 3 is heated to a temperature of from 100° C. to 400° C. and maintained at a temperature within the range preferably for 10 sec to 10 min, and then the thin film 3 is heated to a temperature within the above-mentioned range preferably at a rate of from 10° C./sec to 50° C./sec and maintained at a temperature within the range preferably for 10 sec to 5 min. And then, the thin film 3 is allowed to cool (cooled naturally), or alternatively, the thin film 3 is cooled more slowly using a heater.

The semiconductor layer 3a containing a Group IB element, a Group IIIB element and a Group VIB element, which is to be used as a light absorbing layer, is formed as described above. The semiconductor layer 3a thus obtained may be a semiconductor layer of $CuInSe_2$, $Cu(In,Ga)Se_2$, or $CuIn(S,Se)_2$ or $Cu(In,Ga)(S,Se)_2$ in which a part of Se is substituted with S therein, for example.

Alternatively, the semiconductor layer 3a may be formed as follows.

A thin film 3 which contains a Group IB element and a Group IIIB element and contains no Group VIB element, and which typically consists of a Group IB element and a Group IIIB element, is formed on the electrode layer 2. And then, the thin film is heated in an atmosphere containing at least one Group VIB element, preferably in an atmosphere containing at least one selected from the group consisting of Se and S, to convert the thin film into a semiconductor layer, thereby forming a semiconductor layer containing a Group IB element, a Group IIIB element and a Group VIB element. In that case, the thin film may be formed and heated in the same way as described above.

After forming the semiconductor layer 3a, as illustrated in FIG. 2 (e), for example, a window layer (or buffer layer) 4 and an upper electrode layer 5 are formed on the semiconductor layer 3a, and then extraction electrodes 6, 7 are formed according to a known method, to provide a solar cell. The window layer 4 may be a CdS layer, a ZnO layer or a Zn(O,S) layer, for example. Two or more layers may be formed as the window layer. The upper electrode layer 5 may be a transparent electrode such as ITO and ZnO:Al, for example. An anti-reflective film such as $MgF_2$ may be formed on the upper electrode layer 5.

The configuration of each layer and the process for forming each layer are not limited, and may be appropriately selected.

According to the present invention, a flexible polyimide substrate is used for a CIS solar cell, and therefore a CIS solar cell may be produced in a roll-to-roll process.

In the above description, an example is presented in which a polyimide film is prepared in the form of a detached film which is not laminated on another substrate, and then a metal layer is formed on the surface of the film to provide a laminate. The polyimide film of the present invention may be prepared by flow-casting a polyimide precursor solution on a metal substrate such as a stainless steel to form a coating film of a polyamic acid on the substrate, and then heating the coating film on the substrate to effect imidization, thereby producing a laminate in which a polyimide film is already formed on a substrate. A CIS solar cell, which is described as the present invention, may be formed on the surface of the polyimide insulating layer, which is formed on the metal substrate. In that case, the metal substrate may be treated with various types of coupling agent to improve adherence of the metal layer to the polyimide layer. In that case, as the heat treatment temperature is high, it is necessary to employ a heat-resistant surface treating agent, and an aluminium chelating-based coupling agent, for example, may be preferably used.

EXAMPLES

The present invention will be described in more detail below with reference to the Examples. However, the present invention is not limited to the following Examples.

Physical properties (dimensional change and coefficient of thermal expansion from 25° C. to 500° C., and weight loss after heat treatment at 500° C. for 20 min) of a polyimide film were determined as described above. A thermo-mechanical analyzer TMA/SS6100 made by SII Technology Inc. was used to determine the dimensional change and the coefficient of thermal expansion from 25° C. to 500° C. of polyimide film. A thermogravimetric analyzer TGA-50 made by Shimadzu Corporation was used to determine the weight loss of polyimide film.

The folding endurance was evaluated as follows.

A molybdenum-laminated polyimide film in which Mo films were formed on both sides of a polyimide film was subjected to heat treatment (480° C., 2.5 min), and then Mo films were removed by etching with a aqueous solution of ferric chloride. And then, the MIT number of folding (number of folding until break; curvature radius: 0.38 mm; load: 9.8 N; speed of folding: 175 times/min; angle of folding: 135°, both sides; sample width: 15 mm) was measured.

(Process for Forming Mo Films)

The polyimide film was pre-treated by RF sputtering (power: 2.0 kW/m$^2$). Subsequently, Mo layers with a thickness of 100 nm were formed by DC sputtering on both sides of the polyimide film under the following conditions, to provide a molybdenum-laminated polyimide film. The Mo layer was formed on the Side B, and then the Mo layer was formed on the Side A.

(Mo sputtering conditions)
Power: 40 kW/m$^2$ (DC),
Sputtering gas: Ar,
Chamber pressure: 0.6 Pa,
Polyimide film width: 300 mm,
Feed speed: 0.3 m/min.

<Maximum Dimensional Change (%) in the Temperature-Increasing Step of from 25° C. to 500° C. (MD/TD)>

The dimensional change of a polyimide film relative to the initial dimension (dimension at 25° C. before heat treatment) both in the MD direction (in the continuous film-forming direction; in the length direction) and in the TD direction (in the direction perpendicular to the MD direction; in the width direction) was measured at each temperature in the second temperature-increasing/temperature-decreasing steps, in which the temperature-increasing step of from 25° C. to 500° C. and the subsequent temperature-decreasing step of from 500° C. to 25° C. were repeatedly two times, by a thermo-mechanical analyzer (TMA) under the following conditions.

Measurement mode: Tensile mode, load: 2 g,
Sample length: 15 mm,
Sample width: 4 mm,
Temperature-increasing start temperature: 25° C.,
Temperature-increasing end temperature: 500° C.
(No holding time at 500° C.),
Temperature-decreasing end temperature: 25° C.,
Temperature-increasing and -decreasing rate: 20° C./min,
Measurement atmosphere: Nitrogen.

<Heat Deformation Temperature ($T_M$) of Self-Supporting Film>

The elongation (%) is measured by a thermo-mechanical analyzer (TMA) while heating the self-supporting film under the following conditions, and the heat deformation temperature may be determined from the elongation (%) versus temperature (° C.) graph, as a temperature at which the elongation (%) increases rapidly.

Measurement mode: Tensile mode, load: 4 g,
Sample length: 15 mm,
Sample width: 4 mm,
Temperature-increasing start temperature: 25° C.,
Temperature-increasing end temperature: 500° C.
(No holding time at 500° C.),
Temperature-decreasing end temperature: 25° C.,
Temperature-increasing rate: 20° C./min,
Measurement atmosphere: Air.

Reference Example 1

Preparation of Polyamic Acid Solution

Into a polymerization tank were placed 2,470 parts by weight of N,N-dimethylacetamide, and then 294.33 parts by weight of 3,3',4,4'-biphenyltetracarboxylic dianhydride (s-BPDA) and 108.14 parts by weight of p-phenylenediamine (PPD). And then, the resulting mixture was reacted at 30° C. for 10 hr, to give a polyamic acid solution (polyimide precursor solution). The polyamic acid solution thus obtained had a polymer logarithmic viscosity (measurement temperature: 30° C.; concentration: 0.5 g/100 mL (solvent); solvent: N,N-dimethylacetamide) of 2.66 and a rotational viscosity at 30° C. of 3,100 poise.

Example 1

Preparation of Polyimide Film

To the polyamic acid solution prepared in Reference Example 1 was added 0.1 parts by weight of triethanolamine salt of monostearyl phosphate relative to 100 parts by weight of the polyamic acid, and the resulting mixture was homogeneously mixed, to provide a polyamic acid solution composition. The polyamic acid solution composition thus obtained had a rotational viscosity at 30° C. of 3,000 poise.

In the casting step, the polyamic acid solution composition was continuously flow-cast from a slit of a T-die mold on a smooth support, to form a thin film on the support. The thin film was heated at 131° C. for 1.5 min, at 133° C. for 2.3 min, and then at 119° C. for 2.3 min for drying, and then peeled off from the support, to provide a solidified film (self-supporting film). The highest temperature (T1) in the casting step was 133° C. The region of 133° C. is the stage in which the polyimide precursor solution loses its fluidity (solidifies) by drying Subsequently, in the curing step, the self-supporting film was fed into a continuous heating oven (curing oven) while fixing both edges of the film in the width direction. The temperature of the inlet of the curing oven was 100° C., and the film was carried through a zone at 100° C. for 1.5 min, and then carried through a zone at 127° C. for 1.5 min. The temperatures in these zones were equal to or lower than the heat deformation temperature ($T_M$).

The film was then carried through a zone at 170° C. for 1.5 min. Subsequently, the film was carried through a temperature-increasing zone, and then carried through a zone at the highest temperature of about 500° C. [highest heat treatment temperature (T2)] for 30 sec, to provide a long polyimide film having a thickness of 50 μm, which was wound into a roll.

The properties of the polyimide film thus obtained were evaluated, and the results are shown in Table 1.

The temperature at which the self-supporting film having a weight loss of from 36% to 39% was thermally deformed ($T_M$) was 135° C., which was determined as described above. The self-supporting film had a weight loss of 39%.

Examples 2, 3, Reference Example 1

A long polyimide film having a thickness of 50 μm was produced in the same way as in Example 1, except that the highest temperature in the curing step was changed to 480° C. (Example 2), 520° C. (Example 3) or 460° C. (Reference Example 1). The properties of the polyimide film thus obtained were evaluated, and the results are shown in Table 1.

Comparative Example 1

A long polyimide film having a thickness of 50 μm was produced in the same way as in Example 1, except that the highest temperature in the casting step was changed to 145° C. The properties of the polyimide film thus obtained were evaluated, and the results are shown in Table 1.

TABLE 1

|  | Example 1 | Example 2 | Example 3 | Reference Example 1 | Comparative Example 1 |
|---|---|---|---|---|---|
| Film forming conditions | | | | | |
| Highest temperature in casting step (° C.) | 133 | 133 | 133 | 133 | 145 |
| Highest temperature in curing step (° C.) | 500 | 480 | 520 | 460 | 500 |
| Film evaluation results | | | | | |
| Folding endurance MIT number of folding (number of times) | 8519 | 3540 | 5402 | 2311 | 1574 |
| Dimensional change in temperature-increasing step of 25-500° C. (%) Maximum (MD/TD) | 0.77/0.78 | 0.76/0.78 | 0.79/0.80 | 0.75/0.76 | 1.12/13.1 |
| Weight loss after heat treatment at 500° C. for 20 min (%) | 0.31 | 0.34 | 0.26 | 1.05 | 0.32 |
| Coefficient of thermal expansion of 25-300° C. (ppm/° C.) (MD/TD) | 13.8/13.8 | 13.6/13.7 | 13.8/13.9 | 13.6/13.7 | 20.1/23.4 |
| Coefficient of thermal expansion of 25-500° C. (ppm/° C.) (MD/TD) | 17.2/17.4 | 16.9/17.4 | 17.5/17.8 | 16.7/16.9 | 24.8/29.0 |

INDUSTRIAL APPLICABILITY

As described above, according to the present invention, a CIS solar cell having flexibility and high conversion efficiency may be produced, using a polyimide film having extremely high heat resistance and dimensional stability, which is capable of withstanding a heat treatment at a temperature equal to or higher than 450° C., particularly at a temperature equal to or higher than 480° C.

The polyimide film of the present invention may be suitably used in any applications, other than a CIS solar cell, where the polyimide film should be heated at a high temperature, for example, at a temperature of 450° C. or higher, particularly at a temperature of 480° C. or higher.

REFERENCE SIGNS LIST

1: polyimide substrate
2: electrode layer
3: thin film
3a: semiconductor layer
4: window layer
5: upper electrode layer
6, 7: extraction electrode
8: protective layer

The invention claimed is:

1. A process for producing a CIS solar cell, comprising:
reacting an aromatic tetracarboxylic acid component comprising 3,3',4,4'-biphenyltetracarboxylic dianhydride as the main component and an aromatic diamine component comprising p-phenylenediamine as the main component in a solvent to provide a polyimide precursor solution;
flow-casting the obtained polyimide precursor solution on a support, and heating the solution to form a self-supporting film having a weight loss within a range of from 36% to 39%, this weight loss being calculated by the following formula (A):

Weight loss (%)=(W1−W2)/W1×100     (A)

wherein W1 represents the weight of the self-supporting film, and W2 represents the weight of the polyimide film after curing, wherein
the highest temperature (T1) is equal to or lower than the temperature ($T_M$) at which the self-supporting film is thermally deformed;
heating the obtained self-supporting film to conduct the imidization reaction thereby producing a polyimide film, wherein
the self-supporting film is heated at a temperature lower than the heat deformation temperature ($T_M$), and then the temperature is increased and the film is heated at the highest heat treatment temperature (T2) of from 495° C. to 540° C.;
forming a metal layer on the surface of the polyimide film;
forming a thin film containing a Group IB element, a Group IIIB element and a Group VIB element on or over the metal layer; and
forming a chalcopyrite semiconductor layer by subjecting the thin film to heat treatment at a temperature equal to or higher than 450° C.

2. The process for producing the CIS solar cell according to claim 1, wherein the metal layer is to be used as an electrode layer, and is formed on the side (Side B) of the polyimide film which was in contact with the support when producing the self-supporting film to be converted into the polyimide film.

3. The process for producing the CIS solar cell according to claim 2, wherein a protective layer is formed on the opposite side (Side A) of the polyimide film to Side B.

4. The process for producing the CIS solar cell according to claim 1, wherein the highest temperature (T1) in the casting step is equal to or lower than 140° C.

5. The process for producing the CIS solar cell according to claim 1, wherein the temperature at the middle stage of the casting step is lower than the initial temperature at the starting point of the casting step.

6. The process for producing the CIS solar cell according to claim 1, wherein the polyimide film has a maximum dimensional change in the temperature-increasing step of from 25° C. to 500° C. within a range of from +0.6% to +0.9%, excluding +0.6%, based on the dimension at 25° C. before heat treatment.

7. The process for producing the CIS solar cell according to claim 1, wherein the polyimide film has a weight loss after heat treatment at 500° C. for 20 min within a range equal to or less than 1 wt %.

8. The process for producing the CIS solar cell according to claim 1, wherein the polyimide film has a coefficient of thermal expansion from 25° C. to 500° C. within a range of from 10 ppm/° C. to 20 ppm/° C., excluding 10 ppm/° C.

9. The process for producing the CIS solar cell according to claim 1, wherein the polyimide film has a thickness within a range of from 7.5 μm to 75 μm.

10. The process for producing the CIS solar cell according to claim 1, wherein the metal layer comprises molybdenum.

11. The process for producing the CIS solar cell according to claim 1, wherein the metal layer is formed by sputtering or vapor deposition.

12. A process for producing a CIS solar cell, comprising:
reacting an aromatic tetracarboxylic acid component comprising 3,3',4,4'-biphenyltetracarboxylic dianhydride as the main component and an aromatic diamine component comprising p-phenylenediamine as the main component in a solvent to provide a polyimide precursor solution;
flow-casting the obtained polyimide precursor solution on a support, and heating the solution to form a self-supporting film having a weight loss within a range of from 36% to 39%, this weight loss being calculated by the following formula (A):

Weight loss (%)=(W1−W2)/W1×100　　(A)

wherein W1 represents the weight of the self-supporting film, and W2 represents the weight of the polyimide film after curing, wherein
the highest temperature (T1) is equal to or lower than the temperature ($T_M$) at which the self-supporting film is thermally deformed;
heating the obtained self-supporting film to conduct the imidization reaction thereby producing a polyimide film, wherein
the self-supporting film is heated at a temperature lower than the heat deformation temperature ($T_M$), and then the temperature is increased and the film is heated at the highest heat treatment temperature (T2) of from 495° C. to 540° C.;
forming a metal layer on the surface of the polyimide film;
forming a thin film containing a Group IB element and a Group IIIB element, and no Group VIB element on or over the metal layer; and
forming a chalcopyrite semiconductor layer by subjecting the thin film to heat treatment at a temperature equal to or higher than 450° C. in an atmosphere containing at least one Group VIB element.

13. The process for producing the CIS solar cell according to claim 12, wherein the metal layer is to be used as an electrode layer, and is formed on the side (Side B) of the polyimide film which was in contact with the support when producing the self-supporting film to be converted into the polyimide film.

14. The process for producing the CIS solar cell according to claim 13, wherein a protective layer is formed on the opposite side (Side A) of the polyimide film to Side B.

15. The process for producing the CIS solar cell according to claim 12, wherein the highest temperature (T1) in the casting step is equal to or lower than 140° C.

16. The process for producing the CIS solar cell according to claim 12, wherein the temperature at the middle stage of the casting step is lower than the initial temperature at the starting point of the casting step.

17. The process for producing the CIS solar cell according to claim 12, wherein the polyimide film has a maximum dimensional change in the temperature-increasing step of from 25° C. to 500° C. within a range of from +0.6% to +0.9%, excluding +0.6%, based on the dimension at 25° C. before heat treatment.

18. The process for producing the CIS solar cell according to claim 12, wherein the polyimide film has a weight loss after heat treatment at 500° C. for 20 min within a range equal to or less than 1 wt %.

19. The process for producing the CIS solar cell according to claim 12, wherein the polyimide film has a coefficient of thermal expansion from 25° C. to 500° C. within a range of from 10 ppm/° C. to 20 ppm/° C., excluding 10 ppm/° C.

20. The process for producing the CIS solar cell according to claim 12, wherein the polyimide film has a thickness within a range of from 7.5 μm to 75 μm.

21. The process for producing the CIS solar cell according to claim 12, wherein the metal layer comprises molybdenum.

22. The process for producing the CIS solar cell according to claim 12, wherein the metal layer is formed by sputtering or vapor deposition.

* * * * *

UNITED STATES PATENT AND TRADEMARK OFFICE
CERTIFICATE OF CORRECTION

PATENT NO. : 10,217,884 B2
APPLICATION NO. : 15/274762
DATED : February 26, 2019
INVENTOR(S) : Hiroaki Yamaguchi et al.

Page 1 of 1

It is certified that error appears in the above-identified patent and that said Letters Patent is hereby corrected as shown below:

In the Specification

In Column 1, Line 14, change "reference," to --reference.--.

In Column 9, Lines 40-41, change "diethylene glycol" to --diethyleneglycol--.

In Column 9, Line 45, change "triethylene glycol" to --triethyleneglycol--.

In Column 22, Line 26, change "drying" to --drying.--.

Signed and Sealed this
Third Day of September, 2019

Andrei Iancu
*Director of the United States Patent and Trademark Office*